(12) United States Patent
Wang et al.

(10) Patent No.: US 12,096,557 B2
(45) Date of Patent: Sep. 17, 2024

(54) DISPLAY SYSTEM AND A PAD CONFIGURATION ADAPTABLE THERETO

(71) Applicant: Himax Technologies Limited, Tainan (TW)

(72) Inventors: Hui-Min Wang, Tainan (TW); Yaw-Guang Chang, Tainan (TW)

(73) Assignee: Himax Technologies Limited, Tainan (TW)

(*) Notice: Subject to any disclaimer, the term of this patent is extended or adjusted under 35 U.S.C. 154(b) by 243 days.

(21) Appl. No.: 17/573,102

(22) Filed: Jan. 11, 2022

(65) Prior Publication Data

US 2023/0225051 A1 Jul. 13, 2023

(51) Int. Cl.
*H05K 1/18* (2006.01)
*H05K 1/11* (2006.01)
*H05K 1/14* (2006.01)

(52) U.S. Cl.
CPC .............. *H05K 1/117* (2013.01); *H05K 1/14* (2013.01); *H05K 2201/10136* (2013.01)

(58) Field of Classification Search
CPC . H05K 1/117; H05K 1/14; H05K 2201/10136

USPC .......................................................... 361/749
See application file for complete search history.

(56) References Cited

U.S. PATENT DOCUMENTS

| | | | | |
|---|---|---|---|---|
| 6,583,844 | B1* | 6/2003 | Mishima | G02F 1/13452 |
| | | | | 349/149 |
| 7,449,787 | B2* | 11/2008 | Yamate | G02F 1/1345 |
| | | | | 345/206 |
| 10,921,855 | B1* | 2/2021 | Wen | G09G 3/3275 |
| 2017/0287434 | A1* | 10/2017 | Uekuri | G09G 5/003 |
| 2019/0197942 | A1* | 6/2019 | Kim | G09G 3/3685 |
| 2020/0355972 | A1* | 11/2020 | Jian | G02F 1/1368 |

* cited by examiner

*Primary Examiner* — Binh B Tran
(74) *Attorney, Agent, or Firm* — Donald E. Stout; Stout, Uxa & Buyan, LLP

(57) ABSTRACT

A pad configuration adaptable to a display system includes a plurality of input bond pads, via which a driver of the display system is mounted and signals are inputted to the driver; and a plurality of output bond pads, via which the driver is mounted and signals are outputted to a display panel of the display system. Input and output bond pads corresponding to one of two neighboring drivers are point symmetric with input and output bond pads corresponding to the other of the two neighboring drivers.

13 Claims, 4 Drawing Sheets

DISPLAY SYSTEM AND A PAD CONFIGURATION ADAPTABLE THERETO

BACKGROUND OF THE INVENTION

1. Field of the Invention

The present invention generally relates to a display system, and more particularly to a pad configuration adaptable to a display.

2. Description of Related Art

A liquid-crystal display (LCD) is a flat-panel display that uses the light-modulating properties of liquid crystals. LCDs are used in a wide range of applications such as LCD televisions, computer monitors and mobile phone panels.

In conventional LCDs, the glass panel and the driver integrated circuits (ICs) driving the glass panel are mounted on a printed circuit board (PCB). In order to reduce PCB area and the number of connections required and to provide more flexibility, a chip-on-film (COF) technology is proposed by mounting driver ICs on a film such as flexible printed circuit (FPC). To further reduce bonding area, a chip-on-glass (COG) technology is proposed by mounting driver ICs on contact ledge area of the glass panel.

However, the contact ledge area of conventional COG LCDs is not effectively utilized, and some area is usually wasted. A need has thus arisen to propose a novel LCD to overcome drawbacks of the conventional COG LCDs, thereby substantially reducing border or frame of the glass panel.

SUMMARY OF THE INVENTION

In view of the foregoing, it is an object of the embodiment of the present invention to provide a display system with a pad configuration for chip-on-glass bonding capable of effectively utilizing contact ledge area of a display panel.

According to one embodiment, a display system includes a display panel, two neighboring drivers, a printed circuit board, a flat flexible cable, a plurality of input bond pads and a plurality of output bond pads. The display panel is composed of pixels. The two neighboring drivers controllably drive the pixels of the display panel. The flat flexible cable is electrically connected between the two neighboring drivers and the printed circuit board. A driver is mounted and signals are inputted to the driver via the input bond pads. The driver is mounted and signals are outputted to the display panel via the output bond pads. Input and output bond pads corresponding to one of the two neighboring drivers are point symmetric with input and output bond pads corresponding to the other of the two neighboring drivers.

DETAILED DESCRIPTION OF THE INVENTION

Figure 1:
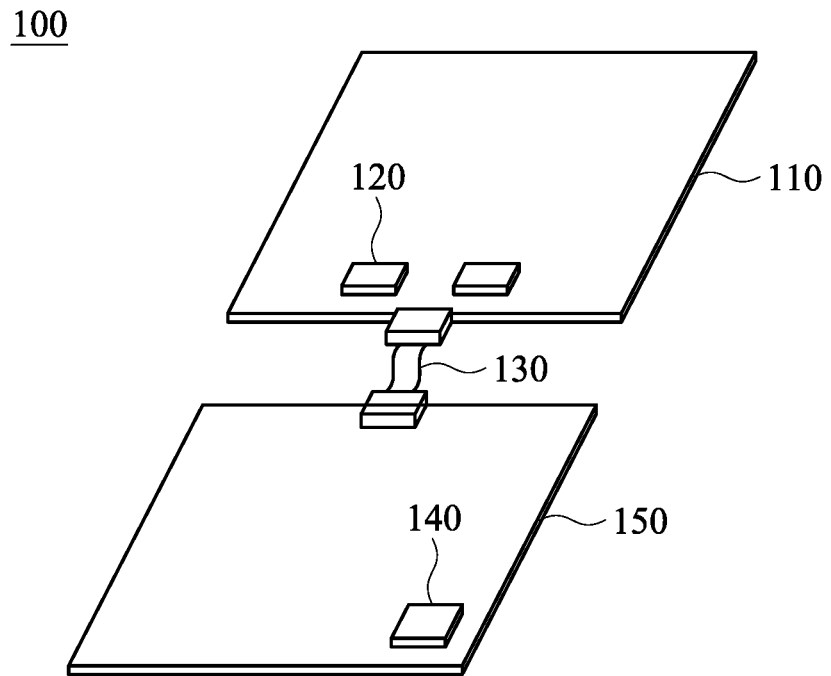
FIG. 1 shows a perspective view illustrating a display system according to one embodiment of the present invention.

FIG. 1 shows a perspective view illustrating a display system 100 according to one embodiment of the present invention. In the embodiment, the display system 100 may include a liquid-crystal display (LCD). Specifically, the display system 100 of the embodiment may include a display panel 110, composed of pixels, with a glass surface.

In the embodiment, the display system 100 may include a plurality of drivers 120 (two are exemplified here), that are configured to controllably drive the pixels of the display panel 110. In one embodiment, the drivers 120 are mounted onto the glass surface of the display panel 110 using a chip-on-glass (COG) technology, which is one of surface-mount technologies. Accordingly, the drivers 120 are also referred to as COG devices in this specification. In the embodiment, the drivers 120 may be touch and display driver integration (TDDI) integrated circuits configured to control both display and touch functions of the display system 100.

The display system 100 of the embodiment may include a flexible printed circuit (FPC) 130 electrically connected between the drivers 120 and a controller 140 mounted on a printed circuit board (PCB) 150. In the specification, the FPC 130 may also be referred to as a flat flexible cable (FFC), which has at least a portion that is bendable. According to another embodiment, the drivers 120 are mounted onto the FPC 130 using a chip-on-film (COF) technology, which is another of surface-mount technologies. Accordingly, the drivers 120 are also referred to as COF devices in this specification.

Figure 2:
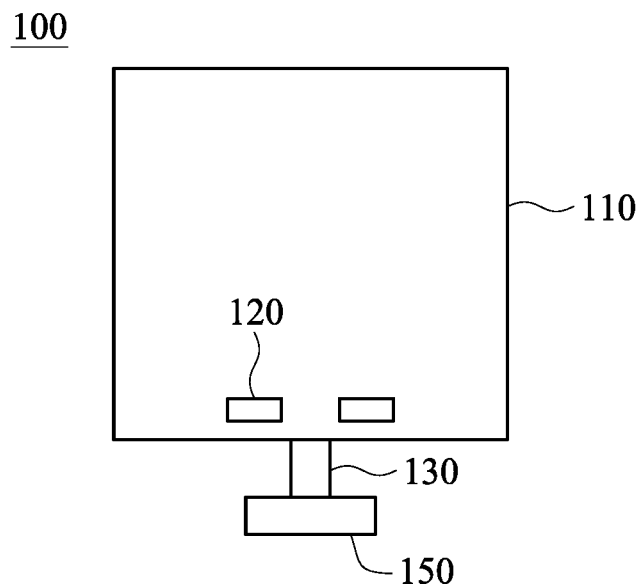
FIG. 2 shows a side view illustrating the display system of FIG. 1.

According to one aspect of the embodiment, as exemplified in FIG. 1, the FPC 130 is disposed in a place being substantially aligned with a gap between two neighboring drivers 120, therefore being shared between these two neighboring drivers 120. FIG. 2 shows a side view illustrating the display system 100 of FIG. 1, showing a portion of the display panel 110, two neighboring drivers 120, the FPC 130 and the PCB 150.

Figure 3A:
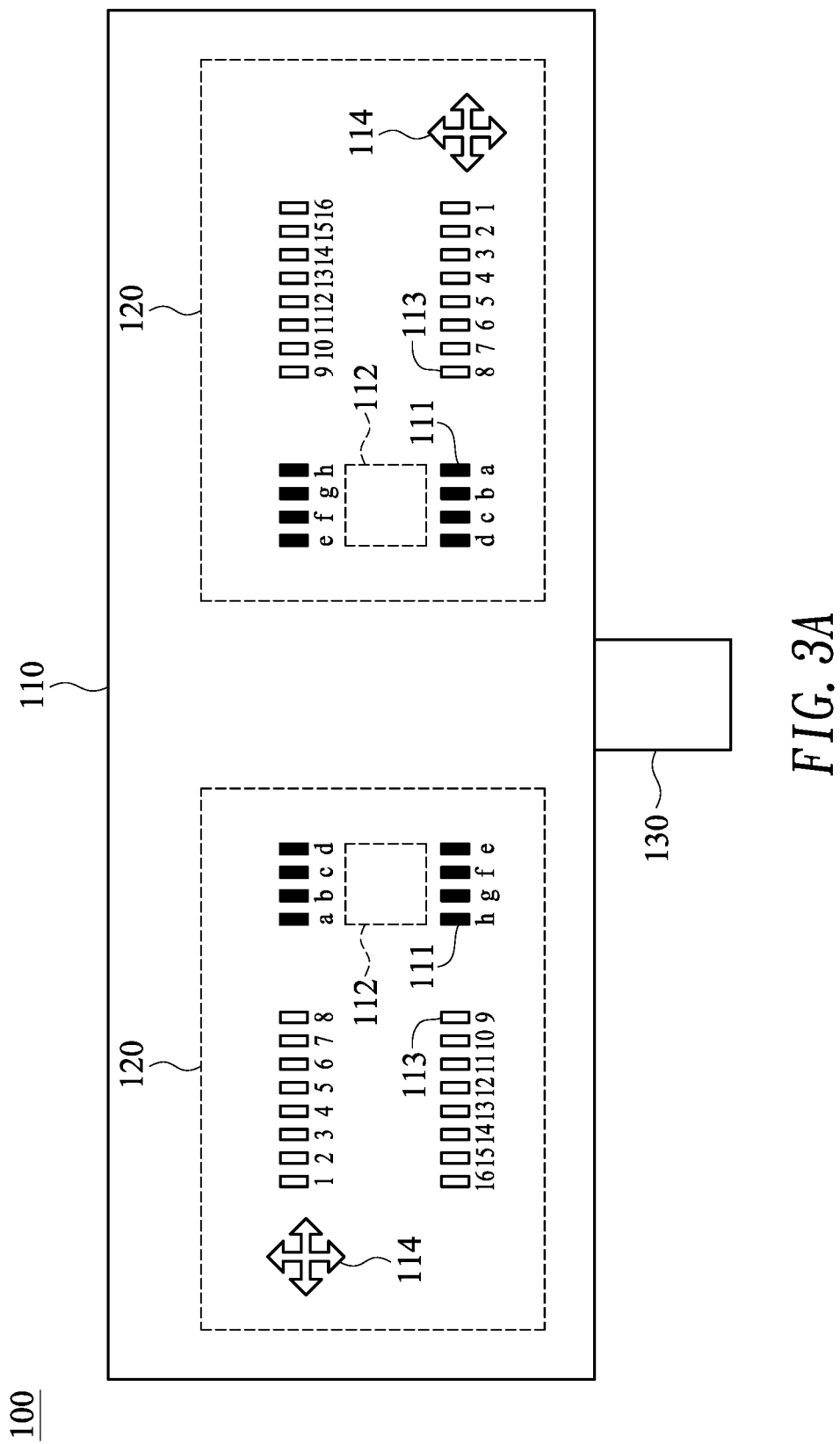
FIG. 3A shows a top view illustrating the display system of FIG. 1 according to one embodiment of the present invention.

FIG. 3A shows a top view illustrating the display system 100 of FIG. 1 according to one embodiment of the present invention. Specifically, the display panel 110 of the embodiment may include a plurality of input bond pads 111 (corresponding to one driver 120), for example, pads a-h, disposed on the glass surface of the display panel 110, via which the driver 120 may be mounted on the display panel 110 and (electrical) signals may be inputted to the driver 120 from the PCB 150 through the FPC 130. It is noted that an input circuit area 112 corresponding to an input circuit of the driver 120 (for processing the input signals) may be allocated adjacent to the input bond pads 111.

The display panel 110 of the embodiment may include a plurality of output bond pads 113 (corresponding to one driver 120), for example, pads 1-16, disposed on the glass surface of the display panel 110, via which the driver 120 may be mounted on the display panel 110 and (electrical) signals may be outputted to the pixels of the display panel 110.

The display panel 110 of the embodiment may include at least one alignment mark 114 (corresponding to one driver 120), disposed on the glass surface of the display panel 110, for aligning the driver 120 with the input/output bond pads 111/113 while performing bonding. The alignment mark 114 may, for example, be disposed on a place corresponding to a corner of the driver 120.

According to another aspect of the embodiment, a pad configuration of the input/output bond pads 111/113 (and the alignment mark 114) corresponding to one of two neighboring drivers 120 is point symmetric (or centrally symmetric) with a pad configuration of the input/output bond pads 111/113 (and the alignment mark 114) corresponding to the other of the two neighboring drivers 120. In other words, a pad configuration of the input/output bond pads 111/113 (and the alignment mark 114) is invariant after being rotated by 180 degrees. Accordingly, a pin configuration of input/output pins (and alignment mark) of one of two neighboring drivers 120 is point symmetric (or centrally symmetric) with a pin configuration of input/output pins (and alignment mark) of the other of the two neighboring drivers 120.

Figure 3B:
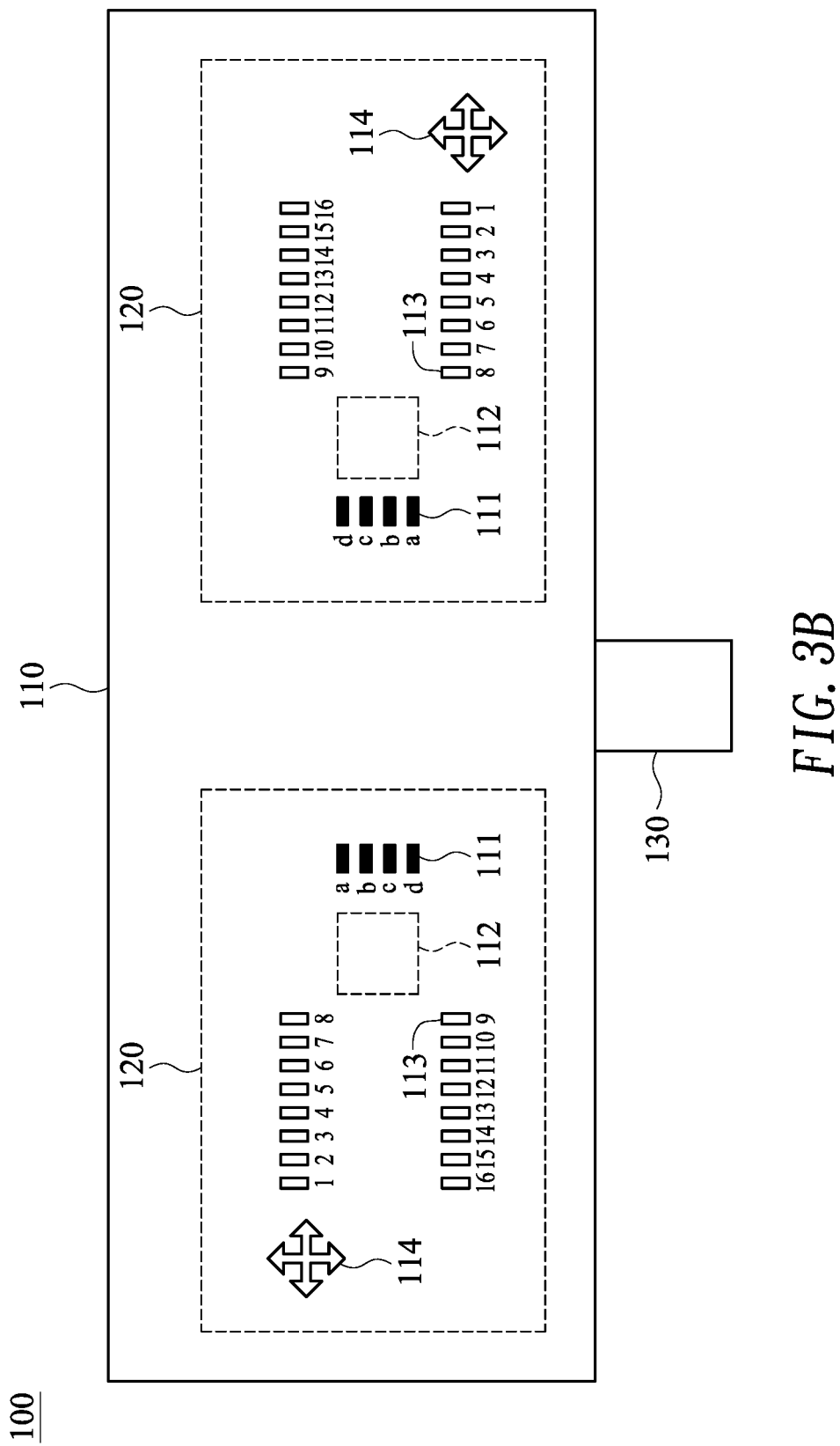
FIG. 3B shows a top view illustrating the display system of FIG. 1 according to another embodiment of the present invention.

FIG. 3B shows a top view illustrating the display system 100 of FIG. 1 according to another embodiment of the present invention. The embodiment of FIG. 3B is similar to the embodiment of FIG. 3A, except that the input bond pads 111 of FIG. 3A are arranged in rows (i.e., oriented in landscape manner) while the input bond pads 111 of FIG. 3B are arranged in column (i.e., oriented in portrait manner).

Figure 4:
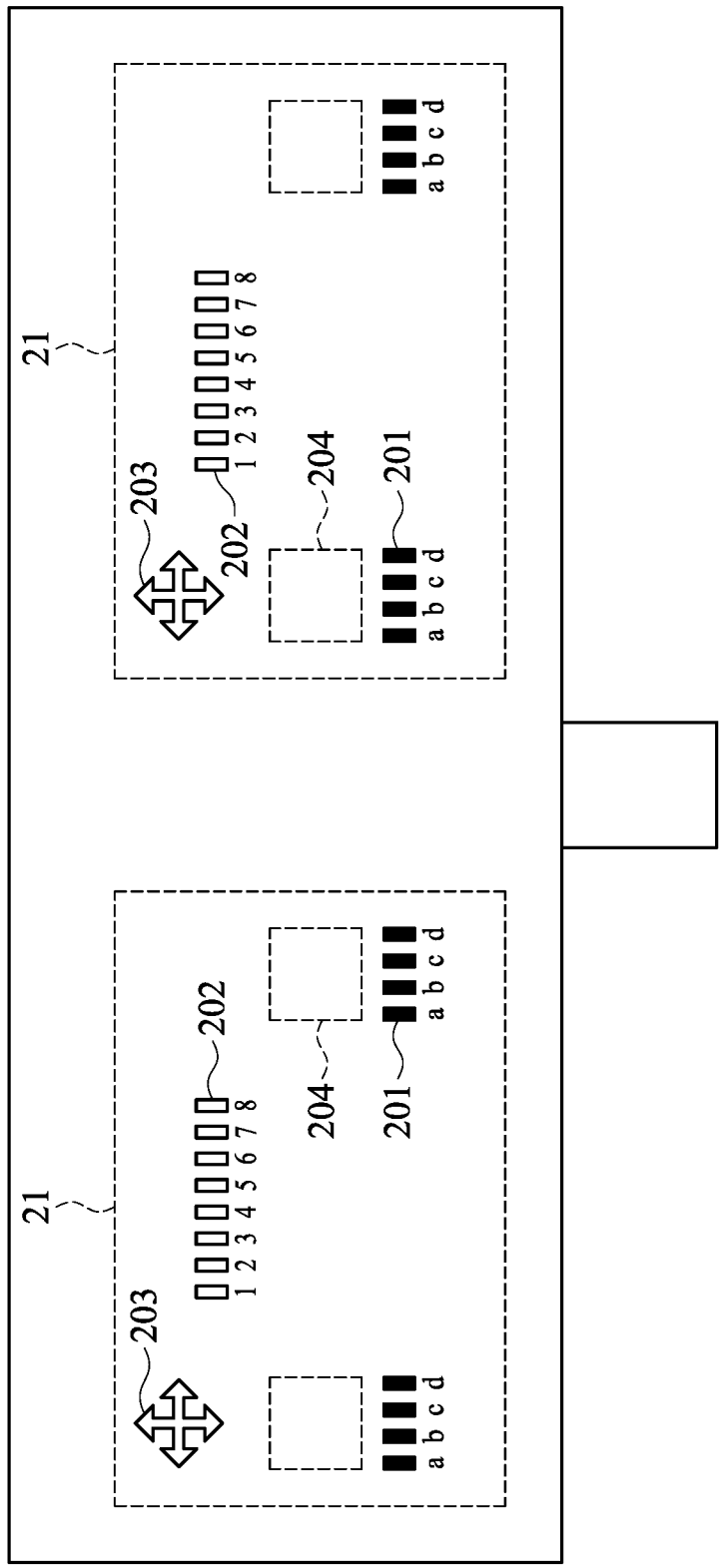
FIG. 4 shows a top view illustrating a display system without adopting the feature of the embodiments of FIG. 3A/3B.

FIG. 4 shows a top view illustrating a display system 200 without adopting the feature of the embodiments of FIG. 3A/3B. It is noted that input bond pads 201, output bond pads 202 and alignment mark 203 of the display system 200 do not possess point symmetry as the embodiments of FIG. 3A/3B. As a consequence, each driver 21 corresponds to two sets of input bond pads 201 and associated input circuit area 204, and only one set is actually used (the other set is thus wasted). For example, the left-hand side driver 21 shown in FIG. 4 uses only the right-hand side input bond pads 201 (and associated input circuit area 204), but dismisses the left-hand side input bond pads 201 (and associated input circuit area 204). Similarly, the right-hand side driver 21 shown in FIG. 4 uses only the left-hand side input bond pads 201 (and associated input circuit area 204), but dismisses the right-hand side input bond pads 201 (and associated input circuit area 204). Accordingly, a substantive portion of area designated for pads in FIG. 4 is wasted and not effectively utilized.

Although specific embodiments have been illustrated and described, it will be appreciated by those skilled in the art that various modifications may be made without departing from the scope of the present invention, which is intended to be limited solely by the appended claims.

What is claimed is:

1. A pad configuration adaptable to a display system, the pad configuration comprising:
a plurality of input bond pads, via which a driver of the display system is mounted and signals are inputted to the driver; and
a plurality of output bond pads, via which the driver is mounted and signals are outputted to a display panel of the display system;
wherein input and output bond pads corresponding to a first driver of two neighboring drivers are point symmetric with input and output bond pads corresponding to a second driver of the two neighboring drivers;
wherein the plurality of input bond pads and the plurality of output bond pads are disposed on a flat surface of the display panel;
wherein a pad configuration of the first driver after being rotated by 180 degrees on a two-dimensional plane of the flat surface of the display panel without leaving the two-dimensional plane during rotation is the same as an original pad configuration of the second driver.

2. The pad configuration of claim 1, wherein the plurality of input bond pads and the plurality of output bond pads are disposed on a glass surface of the display panel using a chip-on-glass technology.

3. The pad configuration of claim 1, wherein the plurality of input bond pads and the plurality of output bond pads are disposed on a flat flexible cable of the display system using a chip-on-film technology.

4. The pad configuration of claim 1, further comprising:
at least one alignment mark corresponding to each driver for aligning said each driver with corresponding input and output bond pads while performing bonding.

5. The pad configuration of claim 4, wherein an alignment mark corresponding to one of the two neighboring drivers is point symmetric with an alignment mark corresponding to the other of the two neighboring drivers.

6. A display system, comprising:
a display panel composed of pixels;
two neighboring drivers for controllably driving the pixels of the display panel;
a printed circuit board;
a flat flexible cable electrically connected between the two neighboring drivers and the printed circuit board;
a plurality of input bond pads, via which a driver is mounted and signals are inputted to the driver; and
a plurality of output bond pads, via which the driver is mounted and signals are outputted to the display panel;
wherein the plurality of input bond pads and the plurality of output bond pads are disposed on a flat surface of the display panel;
wherein input and output bond pads corresponding to a first driver of the two neighboring drivers are point symmetric with input and output bond pads corresponding to a second driver of the two neighboring drivers;
wherein a pad configuration of the first driver after being rotated by 180 degrees on a two-dimensional plane of the flat surface of the display panel without leaving the two-dimensional plane during rotation is the same as an original pad configuration of the second driver.

7. The display system of claim 6, wherein the two neighboring drivers comprise touch and display driver integration (TDDI) integrated circuits.

8. The display system of claim 6, wherein the flat flexible cable is disposed in a place being substantially aligned with a gap between the two neighboring drivers, and is shared between the two neighboring drivers.

9. The display system of claim 6, wherein the flat flexible cable comprises a flexible printed circuit.

10. The display system of claim 6, wherein the plurality of input bond pads and the plurality of output bond pads are disposed on a glass surface of the display panel using a chip-on-glass technology.

11. The display system of claim 6, wherein the plurality of input bond pads and the plurality of output bond pads are disposed on the flat flexible cable using a chip-on-film technology.

12. The display system of claim 6, further comprising:
at least one alignment mark corresponding to each driver for aligning said each driver with corresponding input and output bond pads while performing bonding.

13. The display system of claim 12, wherein an alignment mark corresponding to one of the two neighboring drivers is point symmetric with an alignment mark corresponding to the other of the two neighboring drivers.

\* \* \* \* \*